(12) United States Patent
Lee

(10) Patent No.: US 7,456,651 B2
(45) Date of Patent: Nov. 25, 2008

(54) ON-DIE TERMINATION APPARATUS FOR SEMICONDUCTOR MEMORY HAVING EXACT COMPARISON VOLTAGE CHARACTERISTIC AND METHOD OF CONTROLLING THE SAME

(75) Inventor: Dong-Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/646,358

(22) Filed: Dec. 28, 2006

(65) Prior Publication Data

US 2007/0285293 A1  Dec. 13, 2007

(30) Foreign Application Priority Data

Jun. 8, 2006 (KR) .................. 10-2006-0051377

(51) Int. Cl.
*H03K 19/003* (2006.01)
(52) U.S. Cl. .......................... 326/30; 326/93
(58) Field of Classification Search .................. 326/30
See application file for complete search history.

(56) References Cited

U.S. PATENT DOCUMENTS

| | | | |
|---|---|---|---|
| 6,509,756 B1 * | 1/2003 | Yu et al. ........................ 326/30 |
| 6,809,546 B2 | 10/2004 | Song et al. | |
| 6,928,007 B2 | 8/2005 | Jin | |
| 7,019,555 B2 | 3/2006 | Lee | |
| 7,034,565 B2 | 4/2006 | Lee | |
| 7,034,567 B2 | 4/2006 | Jang | |
| 7,064,989 B2 | 6/2006 | Na et al. | |

FOREIGN PATENT DOCUMENTS

| | | |
|---|---|---|
| JP | 2004 310981 A | 11/2004 |
| JP | 2005 285125 A1 | 10/2005 |
| JP | 2006 129423 A | 5/2006 |

(Continued)

*Primary Examiner*—James H Cho
(74) *Attorney, Agent, or Firm*—Venable LLP; Jeffri A. Kaminski

(57) ABSTRACT

An on-die termination apparatus for a semiconductor memory according to the invention includes: a first D/A converting unit that outputs a first voltage corresponding to a first code; a first comparing unit that compares the first voltage to a reference voltage and corrects comparison results between the first voltage and the reference voltage, to output first comparison signals, wherein the first comparing unit is operated after a lapse of time from an initial operation time of the first D/A converting unit; a first counter that counts up or down the first code to correspond to the first comparison signals; a second D/A converting unit that outputs a second voltage corresponding to a second code; a second comparing unit that compares the second voltage to the reference voltage and corrects comparison results between the second voltage and the reference voltage, to output seconds comparison signals, wherein the second comparing unit is operated after a lapse of time from an initial operation time of the second D/A converting unit; a second counter that counts up or down the second code to correspond to the second comparison signals; and a timing control unit that controls timings when the first D/A converting unit, the first comparing unit, the first counter, the second D/A converting unit, the second comparing unit, and the second counter start to operate.

27 Claims, 6 Drawing Sheets

FOREIGN PATENT DOCUMENTS

| KR | 1019980011412 | | 4/1998 |
| KR | 1020030090955 | A | 12/2003 |
| KR | 1020050012931 | A | 2/2005 |
| KR | 1020050061997 | A | 6/2005 |
| KR | 1020050081315 | A | 8/2005 |
| KR | 1020050104225 | A | 11/2005 |

* cited by examiner

PRIOR ART

ON-DIE TERMINATION APPARATUS FOR SEMICONDUCTOR MEMORY HAVING EXACT COMPARISON VOLTAGE CHARACTERISTIC AND METHOD OF CONTROLLING THE SAME

BACKGROUND OF THE INVENTION

1. Technical Field

The present invention relates to a semiconductor memory apparatus, and more particularly, to an on die termination apparatus and a method of controlling the same.

2. Related Art

In general, when a signal transmitted through a bus line having a predetermined impedance meets another bus line having a different impedance, a part of the signal is lost. A technique for reducing the loss of signal by matching the impedances of the two bus lines is referred to as on-die termination (hereinafter, referred to as ODT).

As illustrated in FIG. 1, a general ODT apparatus includes a first D/A converting unit 10, a first comparing unit 20, a first counter 30, a second D/A converting unit 40, a second comparing unit 50, a second counter 60, and a pulse generating unit 70.

The first D/A converting unit 10 outputs a first voltage ZQP corresponding to a first code PCODE<0:4> according to a first pulse ENABLE. The first comparing unit 20 compares the first voltage ZQP with a reference voltage VREF according to the first pulse ENABLE and a second pulse CPOUTP and outputs the result signal COMP_OUTP. The first counter 30 counts up or down the first code PCODE<0:4> according to a third pulse PCOUNT to correspond to the result signal COMP_OUTP. The second D/A converting unit 40 outputs a second voltage ZQN corresponding to a second code NCODE<0:4> according to the first pulse ENABLE. The second comparing unit 50 compares the second voltage ZQN with the reference voltage VREF according to a fourth pulse CPOUTN and the first pulse ENABLE and outputs the result signal COMP_OUTN. The second counter 60 counts up or down the second code NCODE<0:4> according to a fifth pulse NCOUNT to correspond to the result signal COMP_OUTN. The pulse generating unit 70 generates the first to fifth pulses.

As illustrated in FIG. 2, the first comparing unit 20 includes a primary comparator 21, a transistor M13, a secondary comparator 22, a driver 23. The primary comparator 21 that compares the first voltage ZQP to the reference voltage VREF according to the first pulse ENABLE and outputs the result signals V1 and V1B. The transistor M13 makes the result signals V1 and V1B have the same level according to the first pulse ENABLE. The secondary comparator 22 compares the result signal V1 to the result signal V1B according to the second pulse CPOUTP and outputs the result signals V2 and V2B. The a driver 23 drives the result signals V2 and V2B and outputs the result signal COMP_OUTP. The secondary comparator 50 has the same structure as the primary comparator 20.

The operation of the ODT apparatus for a semiconductor memory having the above-mentioned structure according to the related art will now be described with reference to FIG. 3.

At a timing A1 when the first pulse ENABLE changes to a high level, the first D/A converting unit 10 starts to operate and outputs the first voltage ZQP. Also, at the timing A1, the primary comparator 21 of the first comparing unit 20 compares the first voltage ZQP with reference voltage VREF and outputs the signals V1 and V1B.

At a timing A2 when the second pulse CPOUTP changes to a high level, the secondary comparator 22 of the first comparing unit 20 compares the result signal V1 to the result signal V1B and outputs the result signals V2 and V2B to the driver 23, and the driver 23 drives the result signals V2 and V2B to output the result signal COMP_OUTP.

Then, at a timing A3 when the third pulse PCOUNT changes to a high level, the first counter 30 counts up or down the first code PCODE<0:4> according to the result signal COMP_OUTP and outputs the count result to the first D/A converting unit 10, thereby adjusting the first code PCODE<0:4>.

The second D/A converting unit 40, the second comparing unit 50, and the second counter 60 operate according to the first pulse ENABLE, the fourth pulse CPOUTN, and the fifth pulse NCOUNT in the same manner as the first D/A converting unit 10, the first comparing unit 20, and the first counter 30, thereby adjusting the second code NCODE<0:4>.

A cycle in which the first code PCODE<0:4> and the second code NCODE<0:4> have been adjusted is repeated a predetermined number of times, thereby completing an ODT operation.

However, the ODT apparatus for a semiconductor memory according to the related art has the following problems.

According to the ODT apparatus, the voltages are generated according to the codes while at the same time the comparing operations start. However, at the timing when the comparing operations start, voltage levels according to the codes do not have exact logic values. For this reason, errors occur in the comparison results and thus the ODT is not exactly performed.

Further, when a low voltage VDD is applied to the semiconductor memory, regardless of the comparison timings, the levels of the result signals output from the first comparing unit are too low to normally perform the comparison operation of the second comparing unit. As a result, errors occur in the comparison results and thus the ODT is not exactly performed.

SUMMARY OF THE INVENTION

Embodiments of the present invention provide an ODT apparatus for a semiconductor memory having an improved ODT characteristic and a method of controlling the ODT apparatus.

Other embodiments of the present invention provide an ODT apparatus that can improve a voltage characteristic in an ODT operation and a method of controlling the ODT apparatus. An embodiment of the present invention provides an on-die termination (ODT) apparatus for a semiconductor memory including: a first D/A converting unit that outputs a first voltage corresponding to a first code; a first comparing unit that compares the first voltage to a reference voltage and corrects comparison results between the first voltage and the reference voltage, to output first comparison signals, wherein the first comparing unit is operated after a lapse of time from an initial operation time of the first D/A converting unit; a first counter that counts up or down the first code to correspond to the first comparison signals; a second D/A converting unit that outputs a second voltage corresponding to a second code; a second comparing unit that compares the second voltage to the reference voltage and corrects comparison results between the second voltage and the reference voltage, to output second comparison signals, wherein the second comparing unit is operated after a lapse of time from an initial operation time of the second D/A converting unit; a second counter that counts up or down the second code to correspond to the second comparison signals; and a timing control unit that controls timings when the first D/A converting unit, the first comparing unit, the first counter, the second D/A converting unit, the second comparing unit, and the second counter start to operate.

Another embodiment of the present invention provides an ODT apparatus for a semiconductor memory. The ODT apparatus includes: a D/A converting unit that outputs a voltage corresponding to an input code; a comparing unit that compares the voltage to a reference voltage and corrects comparison results between the voltage and the reference voltage, to output comparison signals, wherein the comparing unit is operated after a lapse of time from an initial operation time of the D/A converting unit; a counter that counts up or down the input code to correspond to the comparison signals; and a timing control unit that outputs a control signal for controlling timings when the D/A converting unit, the comparing unit, and the counter start to operate.

Another aspect of the present invention provides a method of controlling an ODT apparatus for a semiconductor memory including a D/A converting unit, a comparing unit, and a counter. The method includes: operating the D/A converting unit according to a first control signal to generate a predetermined voltage corresponding to a predetermined code; operating the comparing unit according to a second control signal to compare the generated voltage to a reference voltage; and operating the counter according to the comparison results to count the predetermined code.

DESCRIPTION OF EXEMPLARY EMBODIMENT

Embodiments of an ODT apparatus for a semiconductor memory and a method of controlling the ODT apparatus according to the present invention will now be described in detail with reference to the accompanying drawings.

Figure 4:
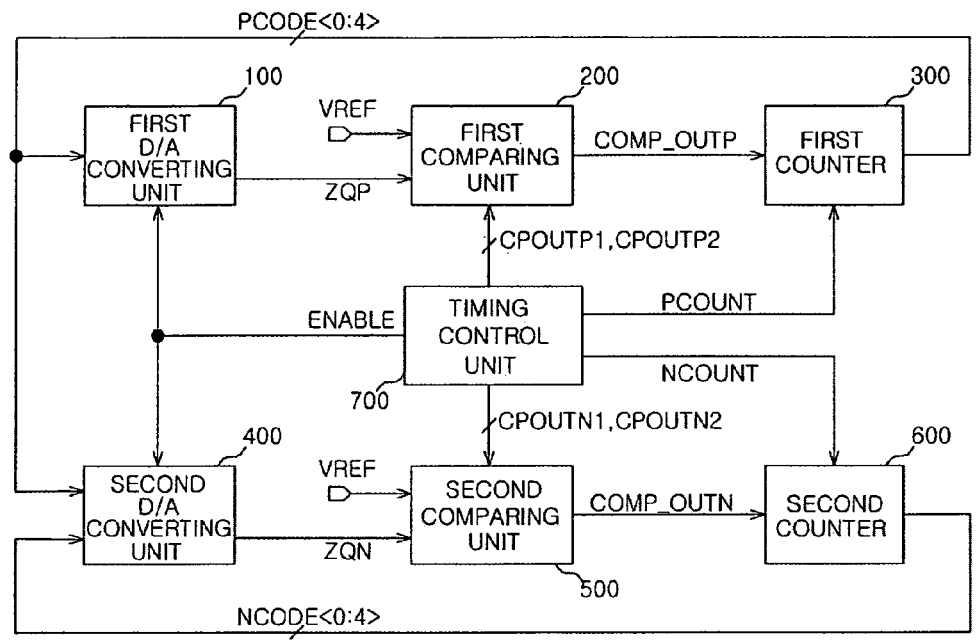
FIG. 4 is a block diagram illustrating the structure of an ODT apparatus for a semiconductor memory according to an embodiment of the invention.

Referring to FIG. 4, an ODT apparatus includes a first D/A converting unit 100, a first comparing unit 200, a first counter 300, a second D/A converting unit 400, a second comparing unit 500, a second counter 600, and a timing control unit 700.

Figure 5:
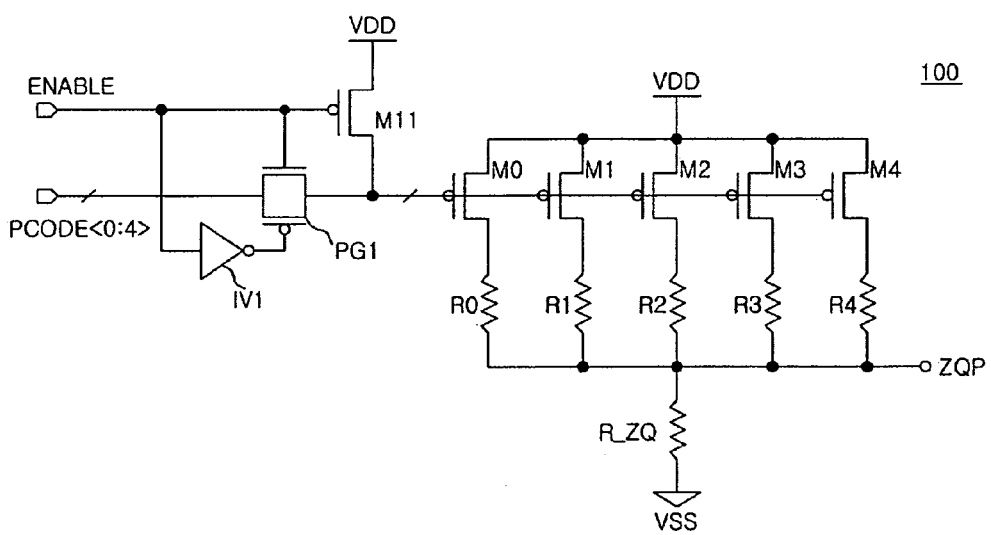
FIG. 5 is a circuit diagram illustrating the structure of a first D/A converting unit illustrated in FIG. 4.

The first D/A converting unit 100 outputs a first voltage ZQP corresponding to a first code PCODE<0:4> according to a first pulse ENABLE. As illustrated in FIG. 5, the first D/A converting unit 100 having the above-mentioned structure includes: a plurality of transistors M0 to M4 having sources connected to a power supply terminal and gates receiving the first code PCODE<0:4>; and a plurality of resistors R0 to R4 connected between drains of the transistors M0 to M4 and an external resistor R_ZQ. Further, the first D/A converting unit 100 includes a plurality of structures each composed of an inverter IV1, a pass gate PG1, and a transistor M11 in order to input the first code PCODE<0:4> to the gates of the plurality of transistors M0 to M4 according to the first pulse ENABLE. The number of the structures is the same as the number of bits of the first code PCODE<0:4>.

Figure 6:
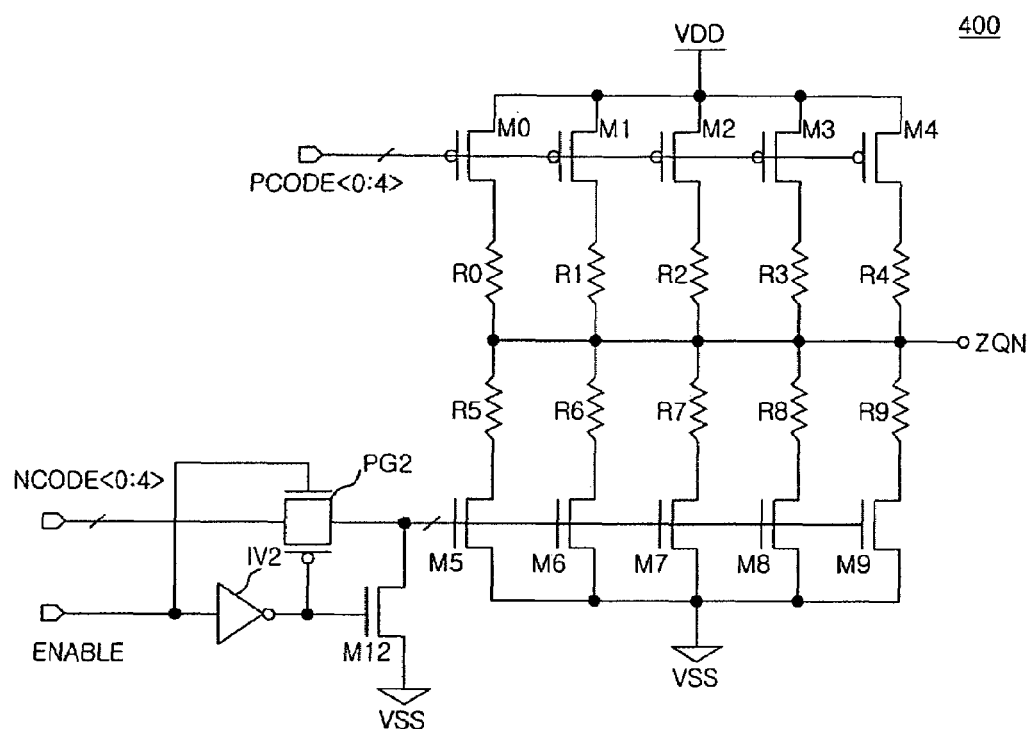
FIG. 6 is a circuit diagram illustrating the structure of a second D/A converting unit illustrated in FIG. 4.

The second D/A converting unit 400 outputs a second voltage ZQN corresponding to a second code NCODE<0:4> according to the first pulse ENABLE. As illustrated in FIG. 6, the second D/A converting unit 400 having the above-mentioned structure includes: a plurality of transistors M0 to M4 having sources connected to a power supply terminal and gates receiving the first code PCODE<0:4>; a plurality of resistors R0 to R4 connected between drains of the transistors M0 to M4 and the external resistor R_ZQ; a plurality of resistors R5 and R9 connected to the resistors R0 to R4; and a plurality of transistors M5 to M9 connected between the resistors R5 and R9 and a ground terminal respectively. Further, the first D/A converting unit 100 includes a plurality of structures each composed of an inverter IV2, a pass gate PG2, and a transistor M12 in order to input the second code NCODE<0:4> to gates of the plurality of transistors M5 to M9 according to the first pulse ENABLE. The number of the structures is the same as the number of bits of the second code NCODE<0:4>.

Figure 7:
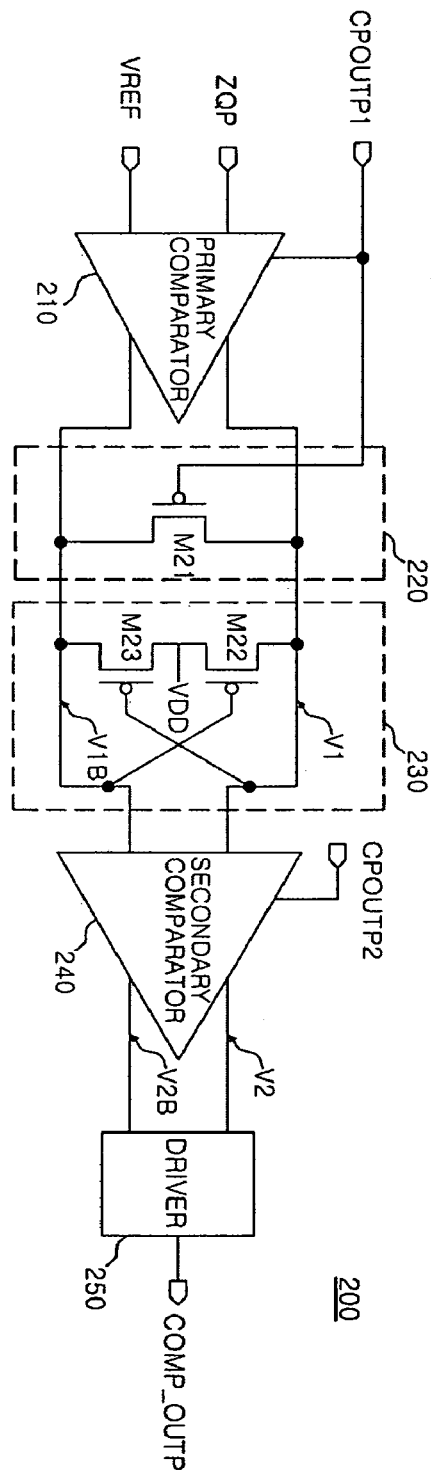
FIG. 7 is a circuit diagram illustrating the structure of a first comparing unit illustrated in FIG. 4.

The first comparing unit 200 compares the first voltage ZQP to a reference voltage VREF according to a second pulse CPOUTP1 and a third pulse CPOUTP2 that are enabled after a lapse of time from an initial enabling time of the first pulse ENABLE, corrects signals obtained as the comparison results, and outputs a first comparison signal COMP_OUTP. As illustrated in FIG. 7, the first comparing unit 200 includes: a primary comparator 210 that compares the first voltage ZQP to the reference voltage VREF according to the second pulse CPOUTP1 to output primary comparison signals V1 and V1B through first and second output lines; an output control unit 220 that connects the first and second output lines of the primary comparator 210 according to the second pulse CPOUTP1 to make the levels of the first and second output lines equal to each other; an output level correcting unit 230 that corrects the primary comparison signals V1 and V1B output from the primary comparator 210 to have exact logic values (1 or 0) that is, the level of a power supply VDD or a ground level; a secondary comparator 240 that compares the corrected primary comparison signals V1 and V1B according to the third pulse CPOUTP2 to output secondary comparison signals V2 and V2B; and a driver 250 that performs a pull-up or pull-down driving operation according to the secondary comparison signals V2 and V2B to output the first comparison signal COMP_OUTP.

The output control unit 220 is composed of a transistor M21 having a source connected to the first output line of the primary comparator 210i a drain connected to the second output line of the primary comparator 210, and a gate receiving the second pulse CPOUTP1.

The output level correcting unit 230 includes: a first transistor M22 having a source to which the power supply voltage VDD is applied, a drain connected to the first output line of the primary comparator 210, and a gate connected to the second output line of the primary comparator 210; and a second transistor M23 having a source to which the power supply voltage VDD is applied, a drain connected to the second output line of the primary comparator 210, and a gate connected to the first output line of the primary comparator 210.

The first counter 300 counts up or down the first code PCODE<0:4> according to a fourth pulse PCOUNT to correspond to the first comparison signal COMP_OUTP.

The second comparing unit 500 compares the second voltage ZQN to the reference voltage VREF according to a fifth pulse CPOUTN1, corrects signals obtained as the comparison results according to a sixth pulse CPOUTN2, and outputs a second comparison signal COMP_OUTN. The structure of the second comparing unit 500 may be the same as the structure of the first comparing unit 200.

The second counter 600 counts up or down the second code NCODE<0: 4> according to a seventh pulse NCOUNT to correspond to the second comparison signal COMP_OUTN.

The timing control unit 700 generates the first to seventh pulses for controlling operation starting timings of the first D/A converting unit 100, the first comparing unit 200, the first counter 300, the second D/A converting unit 400, the second comparing unit 500, and the second counter 600.

A method of controlling the ODT apparatus for a semiconductor memory, having the above-mentioned structure, according to the present invention will now be described with reference to a timing chart of FIG. 8.

Figure 8:
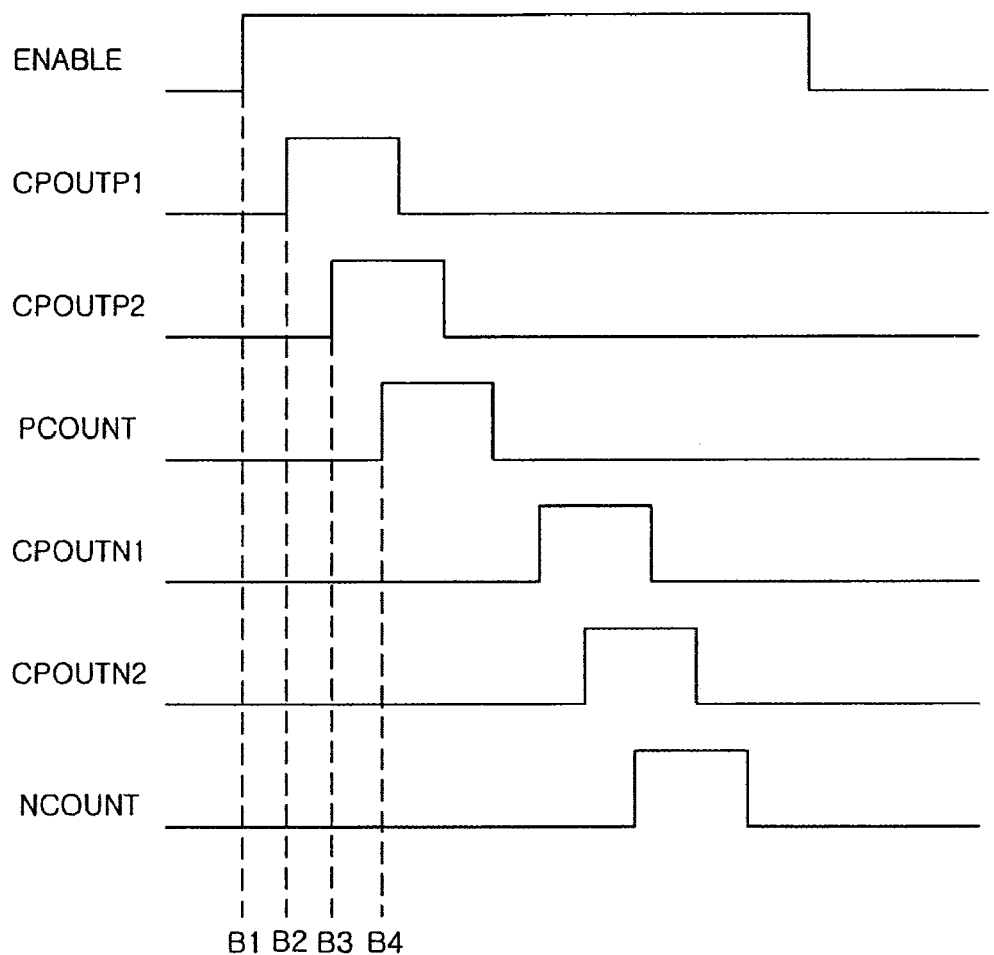
FIG. 8 is a timing chart illustrating the operation of the ODT apparatus for a semiconductor memory according to the embodiment of the invention.

As illustrated in FIG. 8, the timing control unit 700 generates and outputs the pulses ENABLE, CPOUTP1, CPOUTP2, PCOUNT, CPOUTN1 CPOUTN2, and NCOUNT, which have different enabled timings.

At a timing B1 when the first pulse ENABLE changes to a high level, the first D/A converting unit 100 starts to operate and outputs the first voltage ZQP.

Subsequently, at a timing B2 which is a time point after a lapse of time and when the second pulse CPOUTP1 changes to a high level, the primary comparator 210 of the first comparing unit 200 compares the first voltage ZQP and the reference voltage VREF to output the primary comparison signals V1 and V1B. In this case, since the second pulse CPOUTP1 changes to the high level, the transistor M21 of the output control unit 220 is turned off such that the first and second output lines of the primary comparator 210 are separated from each other, resulting in a level difference between the two output lines.

Since, the timing B1 is a time point when the first D/A converting unit 100 starts to operate, it is a time point when the level of the first voltage ZQP does not reach a stable level yet. But, the timing B2 is a time point when the first voltage ZQP reaches the stable level. Therefore, at the timing B2, the primary comparator 210 starts to operate so as to perform an exact comparison operation.

As described above, even though the first comparing unit 200 is operated at a time different from the operational timing of the first D/A converting unit 100, when the power supply voltage VDD applied to the semiconductor memory is low, the outputs of the primary comparator 210 are too low to be equal to or higher than the threshold voltage of the transistors of the secondary comparator 240. That is, it is difficult for the secondary comparator 240 to normally perform the comparing operation.

For this reason, the output level correcting unit 230 serves to correct the primary comparison signals V1 and V1B output from the primary comparator 210 such that the secondary comparator 240 compares the primary comparison signals V1 and V1B.

For example, when the primary comparison signal V1 is higher than the primary comparison signal V1B, the on resistance of the transistor M22 is lower than the on resistance of the second transistor M23. Accordingly, a positive feedback occurs in which the primary comparison signal V1 approaches the level of the power supply VDD through the source of the first transistor M22, whereby the difference between the primary comparison signals V1 and V1B increases and the on resistance difference between the first and second transistors M22 and M23 further increases. Therefore, the level of the primary comparison signal V1 becomes equal to the level of the power supply voltage VDD and thus the level difference between the primary comparison signals V1 and V1B is large. For this reason, the secondary comparator 240 exactly compares the primary comparison signals V1 and V1B. Therefore, even though the level of the power supply voltage for the semiconductor memory is low, it is possible to normally perform the comparing operation.

Further, at a timing B3 when the third pulse CPOUTP2 changes to a high level, the secondary comparator 220 of the first comparing unit 200 compares the primary comparison signals V1 and V1B so as to output the secondary comparison signals V2 and V2B to the driver 250. Then, the driver 250 outputs the first comparison signal COMP_OUTP.

Subsequently, at a timing B4 when the fourth pulse PCOUNT changes to a high level, the first counter 300 counts up or down the first code PCODE<0:4> according to the first comparison signal COMP_OUTP and outputs the count result to the first D/A converting unit 100, thereby adjusting the first code PCODE<0.:4>.

Similarly, the second D/A converting unit 400, the second comparing unit 500, and the second counter 600 operate according to the first pulse ENABLE, the fifth pulse CPOUTN1, the sixth pulse CPOUTN2, and the seventh pulse NCOUNT in the same manner as the first D/A converting unit 100, the first comparing unit 200, and the first counter 300, thereby adjusting the second code NCODE<0:4>.

A cycle in which the first code PCODE<0:4> and the second code NCODE<0:4> are adjusted is repeated a predetermined number of times, thereby completing an ODT operation.

Figure 1:
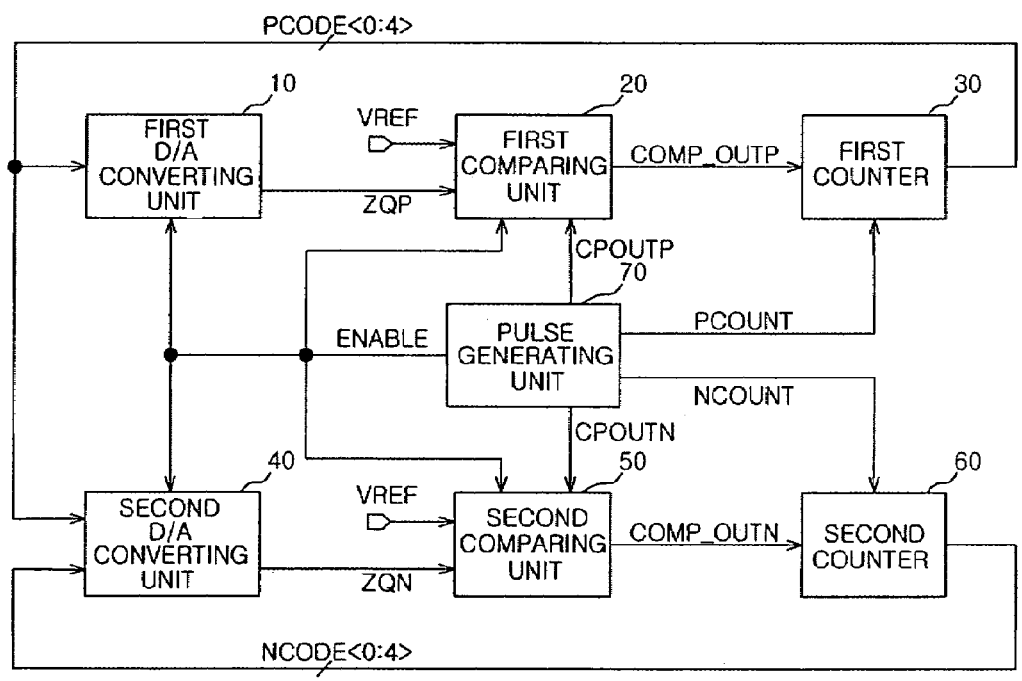
FIG. 1 is a block diagram illustrating the structure of an ODT apparatus for a semiconductor memory according to the related art.
Figure 2:
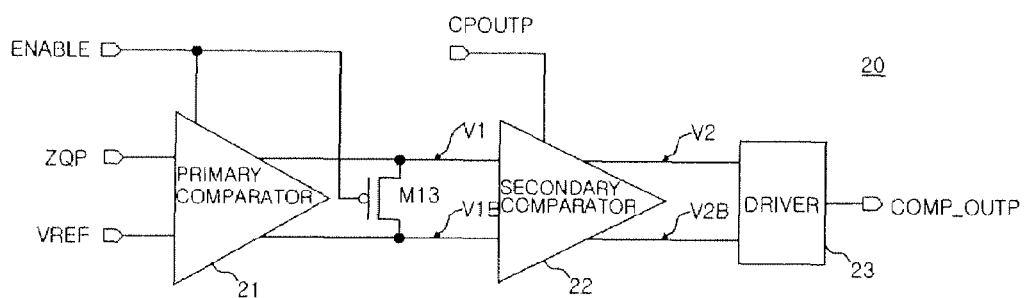
FIG. 2 is a circuit diagram illustrating the structure of a first comparing unit illustrated in FIG. 1.
Figure 3:
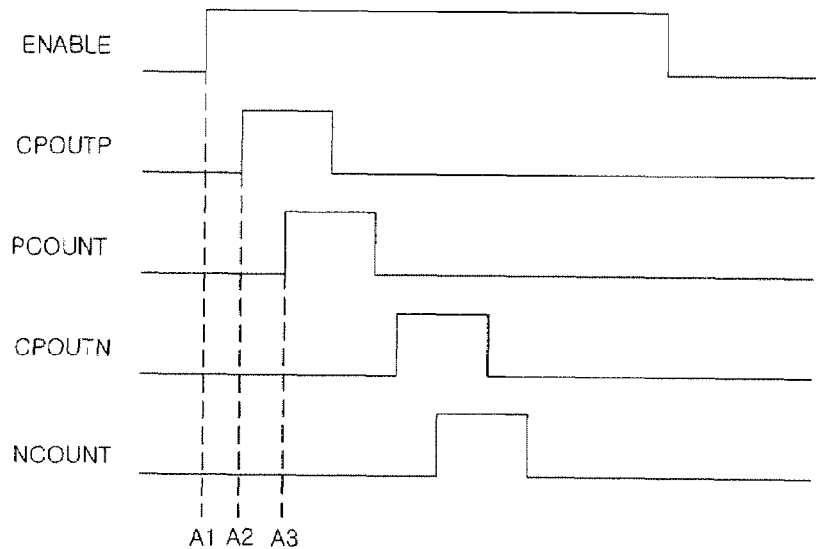
FIG. 3 is a timing chart illustrating the operation of the ODT apparatus for a semiconductor memory according to the related art.

A time point when the adjustment of the second code NCODE<0:4> is completed in this invention is the same as that in the related art. That is, a high level period of the first pulse ENABLE illustrated in FIG. 8 is the same as a high level period of the first pulse ENABLE shown in FIG. 3, and a timing when the seventh pulse NCOUNT shown in FIG. 8 changes from the high level to the low level is also the same as a timing when the fifth pulse NCOUNT shown in FIG. 3 changes from the high level to the low level. Consequently, it is possible to more exactly perform the ODT operation within the same time period as the related art.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

According to the invention, since the comparing operation starts after the voltages generated according to the code take exact logic values, the ODT operation is exactly performed.

Further, since level correction is performed in the operation in which the voltages generated according to the code are compared to each other, regardless of the level of the power supply voltage for the semiconductor memory, that is, even when the level of the power supply voltage VDD is low, the comparing operation is exactly performed. As a result, it is possible to improve the reliability of the ODT.

What is claimed is:

1. An on-die termination (ODT) apparatus for a semiconductor memory, comprising:
   a first D/A converting unit that outputs a first voltage corresponding to a first code;
   a first comparing unit that compares the first voltage with a reference voltage and corrects comparison results between the first voltage and the reference voltage, to output first comparison signals, wherein an initial operating time of the first comparing unit is later than an initial operation time of the first D/A converting unit;
   a first counter that counts up or down the first code to correspond to the first comparison signals;
   a second D/A converting unit that outputs a second voltage corresponding to a second code;
   a second comparing unit that compares the second voltage with the reference voltage and corrects comparison results between the second voltage and the reference voltage, to output second comparison signals, wherein an initial operating time of the second comparing unit is later than an initial operation time of the second D/A converting unit;
   a second counter that counts up or down the second code to correspond to the second comparison signals; and
   a timing control unit that controls timings when the first D/A converting unit, the first comparing unit, the first counter, the second D/A converting unit, the second comparing unit, and the second counter start to operate.

2. The ODT apparatus for a semiconductor memory of claim 1,
   wherein the first D/A converting unit includes:
   a plurality of transistors that have sources connected to a power supply terminal and gates receiving the first code;
   a plurality of resistors that are connected between drains of the transistors and an external resistor; and
   a plurality of switching elements that input the first code to the gates of the transistors, the number of switching elements being the same as the number of bits of the first code.

3. The ODT apparatus for a semiconductor memory of claim 1,
   wherein the second D/A converting unit includes:
   a plurality of first transistors that have sources connected to a power supply terminal and gates receiving the first code;
   a plurality of first resistors that are connected between drains of the first transistors and an external resistor;
   a plurality of second resistors that are connected to the first resistors;
   a plurality of second transistors that are connected between the second resistors and a ground terminal; and
   a plurality of switching elements that input the second code to gates of the second transistors, the number of switching elements being the same as the number of bits of the second code.

4. The ODT apparatus for a semiconductor memory of claim 1,
   wherein the first comparing unit includes:
   a comparator that compares the first voltage with the reference voltage to output comparison signals through first and second output lines, wherein the comparator is operated after a predetermined time from an initial operation time of the first D/A converting unit;
   an output level correcting unit that corrects the levels of the comparison signals to have exact logic levels; and
   a driver that drives the corrected comparison signals and outputs the first comparison signals.

5. The ODT apparatus for a semiconductor memory of claim 4,
   wherein the output level correcting unit includes:
   a first transistor that has a source to which a power supply voltage is applied, a drain connected to the first output line of the comparator, and a gate connected to the second output line of the comparator; and
   a second transistor that has a source to which the power supply voltage is applied, a drain connected to the second output line of the comparator, and a gate connected to the first output line of the comparator.

6. The ODT apparatus for a semiconductor memory of claim 1,
   wherein the second comparing unit includes:
   a comparator that compares the second voltage with the reference voltage to output comparison signals through first and second output lines, wherein the comparator is operated after a predetermined time from an initial operation time of the second D/A converting unit;
   an output level correcting unit that corrects the levels of the comparison signals to have exact logic levels; and
   a driver that drives the corrected comparison signals and outputs the second comparison signals.

7. The ODT apparatus for a semiconductor memory of claim 6,
   wherein the output level correcting unit includes:
   a first transistor that has a source to which a power supply voltage is applied, a drain connected to the first output line of the comparator, and a gate connected to the second output line of the comparator; and
   a second transistor that has a source to which the power supply voltage is applied, a drain connected to the second output line of the comparator, and a gate connected to the first output line of the comparator.

8. The ODT apparatus for a semiconductor memory of claim 6, further comprising:
   a second comparator that compares the comparison signals output through the first and second output lines of the comparator and outputs second comparison signals to the driver.

9. The ODT apparatus for a semiconductor memory of claim 6,
   wherein the timing control unit includes a pulse generator that generates at least one pulse for controlling the timings when the first D/A converting unit, the first comparing unit, the first counter, the second D/A converting unit, the second comparing unit, and the second counter start to operate.

10. The ODT apparatus for a semiconductor memory of claim 1,
    wherein the first comparing unit is configured to compare the first voltage with the reference voltage after a predetermined time from an initial operating the first D/A converter, to correct output levels of the comparison results between the first voltage and the reference voltage, and to compare the corrected comparison results after a predetermined time from a timing when the operation of the first comparing unit is started, thereby outputting the first comparison signals.

11. The ODT apparatus for a semiconductor memory of claim 1,
    wherein the second comparing unit is configured to compare the second voltage with the reference voltage after a predetermined time from an initial operating the second D/A converter, to correct output levels of the comparison results between the second voltage and the reference voltage, and to compare the corrected comparison results after a predetermined time from a timing when the operation of the second comparing unit is started, thereby outputting the second comparison signals.

12. The ODT apparatus for a semiconductor memory of claim 1,
wherein the first D/A converting unit is operated according to a first control signal,
wherein the first comparing unit includes:
a first comparator that compares the first voltage with the reference voltage according to a second control signal, to output preliminary comparison signals through first and second output lines;
an output level correcting unit that corrects the output levels of the preliminary comparison signals to have exact logic levels;
an output control unit that arranges between the first comparator and the output level correcting unit and connects the first and second output lines of the first comparator such that the levels of the first and second lines are equal to each other;
a second comparator that compares the corrected preliminary comparison signals according to a third control signal; and
a driver that drives an output signal of the second comparator, to output the first comparison signals,
wherein the second control signal is enabled later than the first control signal, and the third control signal is enabled later than the second control signal.

13. The ODT apparatus for a semiconductor memory of claim 1,
wherein the second D/A converting unit is operated according to a first control signal,
wherein the second comparing unit includes:
a first comparator that compares the second voltage with the reference voltage according to a second control signal, to output preliminary comparison signals through first and second output lines;
an output level correcting unit that corrects the output levels of the preliminary comparison signals to have exact logic levels;
an output control unit that arranges between the first comparator and the output level correcting unit and connects the first and second output lines of the first comparator such that the levels of the first and second lines are equal to each other;
a second comparator that compares the corrected preliminary comparison signals according to a third control signal; and
a driver that drives an output signal of the second comparator, to output the second comparison signals,
wherein the second control signal is enabled later than the first control signal, and the third control signal is enabled later than the second control signal.

14. A method of controlling an ODT apparatus for a semiconductor memory including a D/A converting unit, a comparing unit, and a counter, comprising:
operating the D/A converting unit according to a first control signal to generate a predetermined voltage corresponding to a predetermined code;
operating the comparing unit according to a second control signal;
correcting levels of preliminary output signals of the comparing unit, and comparing the corrected preliminary output signals according to a third control signal, thereby outputting comparison signals; and
operating the counter according to the comparison signals to count the predetermined code.

15. The method of controlling an ODT apparatus for a semiconductor memory of claim 14,
wherein the second control signal is enabled later than the first control signal, and the third control signal is enabled later than the second control signal.

16. An ODT apparatus for a semiconductor memory, comprising:
a D/A converting unit that outputs a voltage corresponding to an input code according to a first control signal;
a comparing unit that compares the voltage to a reference voltage according to a second control signal, corrects comparison results between the voltage and the reference voltage, and compares the corrected comparison results according to a third control signal to output comparison signals,
a counter that counts up or down the input code to correspond to the comparison signals; and
a timing control unit that outputs a control signal for controlling timings when the D/A converting unit, the comparing unit, and the counter start to operate;
wherein the second control signal is enable later than the first control signal and the third control signal is enabled later than the second control signal.

17. The ODT apparatus for a semiconductor memory of claim 16,
wherein the D/A converting unit includes:
a first D/A converting unit that outputs a first voltage corresponding to a first code; and
a second D/A converting unit that outputs a second voltage corresponding to a second code.

18. The ODT apparatus for a semiconductor memory of claim 17,
wherein the first D/A converting unit includes:
a plurality of transistors that have sources connected to a power supply terminal and gates receiving the first code;
a plurality of resistors that are connected between drains of the transistors and an external resistor; and
a plurality of switching elements that input the first code to the gates of the transistors, the number of switching elements being the same as the number of bits of the first code.

19. The ODT apparatus for a semiconductor memory of claim 17,
wherein the second D/A converting unit includes:
a plurality of first transistors that have sources connected to a power supply terminal and gates receiving the first code;
a plurality of first resistors that are connected between drains of the first transistors and an external resistor;
a plurality of second resistors that are connected to the plurality of first resistors;
a plurality of second transistors that are connected between the resistors and a ground terminal; and
a plurality of switching elements that input the second code to gates of the transistors, the number of switching elements being the same as the number of bits of the second code.

20. The ODT apparatus for a semiconductor memory of claim 16,
wherein the comparing unit includes:
a first comparing unit that compares a first voltage output from the D/A converting unit to the reference voltage and corrects the D/A converting unit to the reference voltage to output first comparison signals, wherein the first comparing unit is operated after a predetermined time from an initial operation time of the first D/A converting unit; and a second comparing unit that compares a second voltage output from the D/A converting unit to the reference voltage and corrects the second voltage and the reference voltage, to output second comparison signals, wherein the second comparing unit is operated after a predetermined time from an initial operation time of the second D/A converting unit.

21. The ODT apparatus for a semiconductor memory of claim 20, wherein the first comparing unit includes:

a first comparator that compares the first voltage to the reference voltage according to the second control signal and outputs preliminary comparison signals through first and second output lines;

an output level correcting unit that corrects the levels of the preliminary comparison signals to have exact logic levels;

a second comparator that compares the corrected preliminary comparison signals according to the third control signal, and a driver that drives output signals of the second comparator to output the first comparison signals.

22. The ODT apparatus for a semiconductor memory of claim 20, wherein the second comparing unit includes:

a first comparator that compares the second voltage to the reference voltage according to the second control signal and outputs preliminary comparison signals through first and second output lines;

an output level correcting unit that corrects the levels of the preliminary comparison signals to have exact logic levels;

a second comparator that compares the corrected preliminary comparison signals according to the third control signals, and a driver that drives output signals of the second comparator to output the second comparison signals.

23. The ODT apparatus for a semiconductor memory of claim 20, wherein the output level correcting unit includes:

a first transistor that has a source to which a power supply voltage is applied, a drain connected to the first output line of the comparator, and a gate connected to the second output line of the comparator; and a second transistor that has a source to which the power supply voltage is applied, a drain connected to the second output line of the comparator, and a gate connected to the first output line of the comparator.

24. The ODT apparatus for a semiconductor memory of claim 20, further comprising:

wherein the first comparing unit or the second comparing unit includes a first line and a second line for transferring the first or second voltage and the reference voltage, wherein the first comparing unit or the second comparing unit further comprises:

an output control unit that connects the first and second lines such that the levels of the first and second lines are equal to each other.

25. The ODT apparatus for a semiconductor memory of claim 24, wherein the output control unit includes composed of a transistor that has a source and a drain connected to the first and second output lines of the comparator, respectively.

26. The ODT apparatus for a semiconductor memory of claim 20, wherein the counter includes:

a first counter that counts up or down a first input code to correspond to the first comparison signals; and a second counter that counts up or down a second input code to correspond to the second comparison signals.

27. The ODT apparatus for a semiconductor memory of claim 16, wherein the timing control unit is composed of a pulse generator that generates at least one pulse for controlling the timings when the D/A converting unit, the comparing unit, and the counter start to operate.

* * * * *